US012615860B2

(12) United States Patent
Albagli et al.

(10) Patent No.: US 12,615,860 B2
(45) Date of Patent: Apr. 28, 2026

(54) X-RAY DETECTOR WITH RECTANGULAR PIXELS

(71) Applicant: GE Precision Healthcare LLC, Waukesha, WI (US)

(72) Inventors: Douglas Albagli, Clifton Park, NY (US); Marc Schaepkens, Brookfield, WI (US); Herve Blanc, Buc (FR)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 198 days.

(21) Appl. No.: 18/665,396

(22) Filed: May 15, 2024

(65) Prior Publication Data

US 2025/0359364 A1 Nov. 20, 2025

(51) Int. Cl.
*H10F 39/00* (2025.01)
*G01T 1/02* (2006.01)
*G01T 1/20* (2006.01)
*H10F 39/18* (2025.01)

(52) U.S. Cl.
CPC ......... *H10F 39/8027* (2025.01); *G01T 1/023* (2013.01); *G01T 1/20184* (2020.05); *H10F 39/1895* (2025.01); *H10F 39/1898* (2025.01); *H10F 39/8023* (2025.01)

(58) Field of Classification Search
CPC ............. H10F 39/8027; H10F 39/8023; G01T 1/20184
See application file for complete search history.

(56) References Cited

U.S. PATENT DOCUMENTS

| | | | |
|---|---|---|---|
| 5,340,988 A | 8/1994 | Kingsley et al. | |
| 6,166,384 A | 12/2000 | Dentinger et al. | |
| 7,495,228 B1 | 2/2009 | Albagli et al. | |
| 8,605,862 B2 | 12/2013 | Granfors et al. | |
| 9,438,866 B2 | 9/2016 | Solhusvik et al. | |
| 2007/0257197 A1* | 11/2007 | Gordon, III | G01T 7/00 250/370.11 |
| 2009/0290680 A1* | 11/2009 | Tumer | G01T 1/247 250/311 |
| 2012/0104267 A1* | 5/2012 | Matsumoto | H04N 25/616 250/370.08 |
| 2012/0199750 A1* | 8/2012 | Kondou | H04N 25/67 250/370.09 |
| 2013/0082264 A1* | 4/2013 | Couture | G01T 1/2018 257/E29.273 |
| 2013/0146776 A1 | 6/2013 | Mollov | |
| 2015/0139392 A1* | 5/2015 | Maack | H05G 1/085 378/62 |
| 2020/0200923 A1* | 6/2020 | Nishihara | A61B 6/44 |

* cited by examiner

*Primary Examiner* — Hugh Maupin
(74) *Attorney, Agent, or Firm* — McCoy Russell LLP

(57) ABSTRACT

Systems and methods are herein provided for a radiation detector with rectangular pixels. In one example, an x-ray imaging system comprises a pixel array of a flat panel detector comprising a plurality of pixels with a rectangular pixel pitch arranged in pairs, wherein each of the plurality of pixels is configured to generate respective image data signals, wherein in low-dose applications, TFT control lines of pixels in each pixel pair are energized simultaneously to generate signals with an effective pixel pitch of twice the rectangular pixel pitch and in high-dose applications, TFT control lines of pixels in each pixel pair are energized sequentially and the detector is translated during image acquisition for an effective pixel pitch of half the rectangular pixel pitch.

20 Claims, 6 Drawing Sheets

X-RAY DETECTOR WITH RECTANGULAR PIXELS

FIELD

Embodiments of the subject matter disclosed herein relate to medical imaging, and more particularly to an x-ray detector with rectangular pixels.

BACKGROUND

Solid state radiation imagers are used for imaging non-optical radiation such as x-rays and high energy nuclear radiation such as gamma rays. Incident radiation is typically detected in solid state imagers through a process in which the incident radiation is absorbed in a scintillator, resulting in the generation of optical photons. Photosensors, such as photodiodes or the like, disposed in an array adjacent to the scintillator detect the optical photons. This location in the array of the photosensor detecting the light and the intensity of the signal generated by the photosensor are processed for display and analysis of the incident radiation. Alternatively, the incident radiation may be absorbed directly in photo-sensitive elements which convert the energy of the incident radiation into mobile charge particles.

One typical use of solid state radiation imaging systems is medical imaging, in which radiation passing through or emanating from a patient's body is used to visualize objects or materials within the body. Medical imaging devices preferably exhibit high spatial frequency response and high signal to noise ratio while maintaining feasible manufacturing and operating expenditures for various types of scans.

BRIEF DESCRIPTION

In one example, an x-ray imaging system comprises a photosensor pixel array of a detector comprising a plurality of pixels with a rectangular pixel pitch, wherein the plurality of pixels are arranged in pairs and each of the plurality of pixels is configured to generate respective image data signals via a thin film transistor (TFT), a TFT control line, and a data read out line, wherein in low-dose applications, TFT control lines of pixels in each pixel pair are energized simultaneously to generate the respective image data signals with a first effective pixel pitch of twice the rectangular pixel pitch and in high-dose applications, TFT control lines of pixels in each pixel pair are energized sequentially to generate the respective image data signals with the rectangular pixel pitch; and a controller coupled to said photosensor pixel array so as to receive the respective image data signals generated by the plurality of pixels, wherein, in the high-dose applications, the controller is configured to translate between a first position and a second position to generate two image data signals for each pixel of the plurality of pixels and the controller is configured to combine the two image data signals to generate image data signals with a second effective pixel pitch of half the rectangular pixel pitch.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 1:
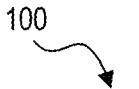
FIG. 1 shows a pictorial view of an imaging system, according to an embodiment.
Figure 1:
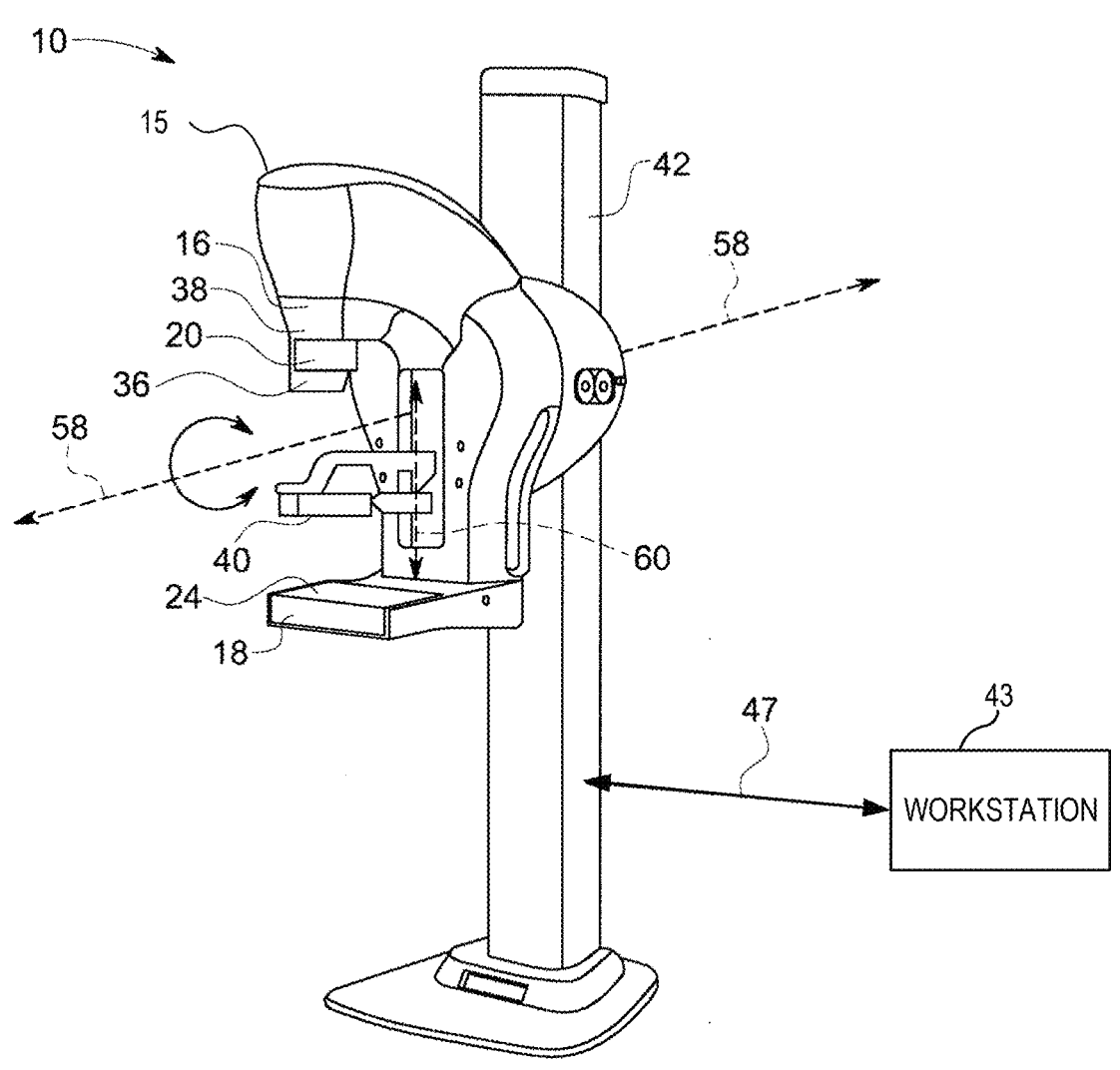
Figure 2:
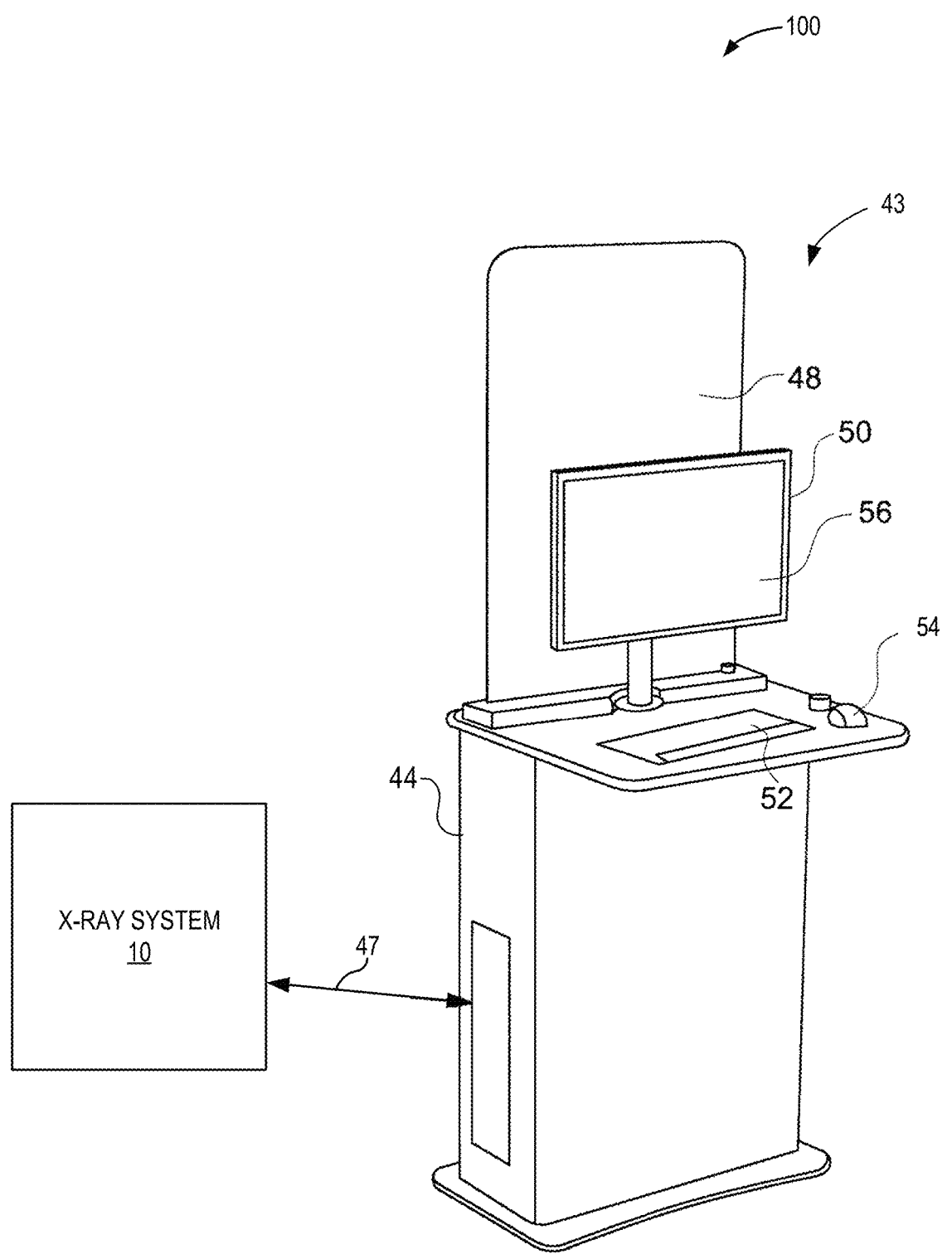
FIG. 2 shows a pictorial view of an exemplary imaging system, according to an embodiment.
Figure 3:
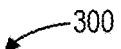
FIG. 3 shows an exemplary pair of rectangular pixels of a pixel array, according to an embodiment.
Figure 4:
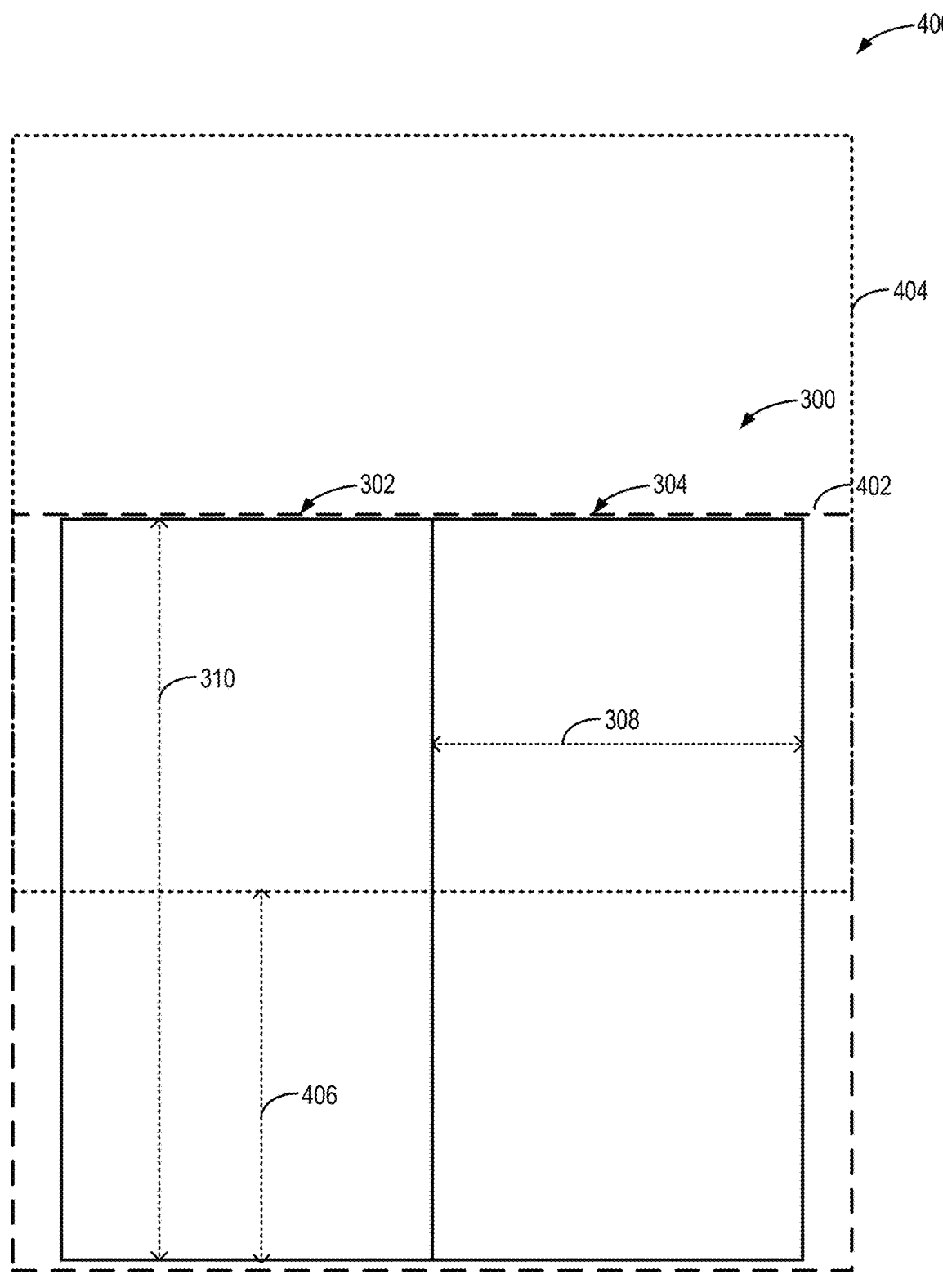
FIG. 4 shows a relative position of an x-ray detector compared to the pair of rectangular pixels, according to an embodiment.
Figure 5:
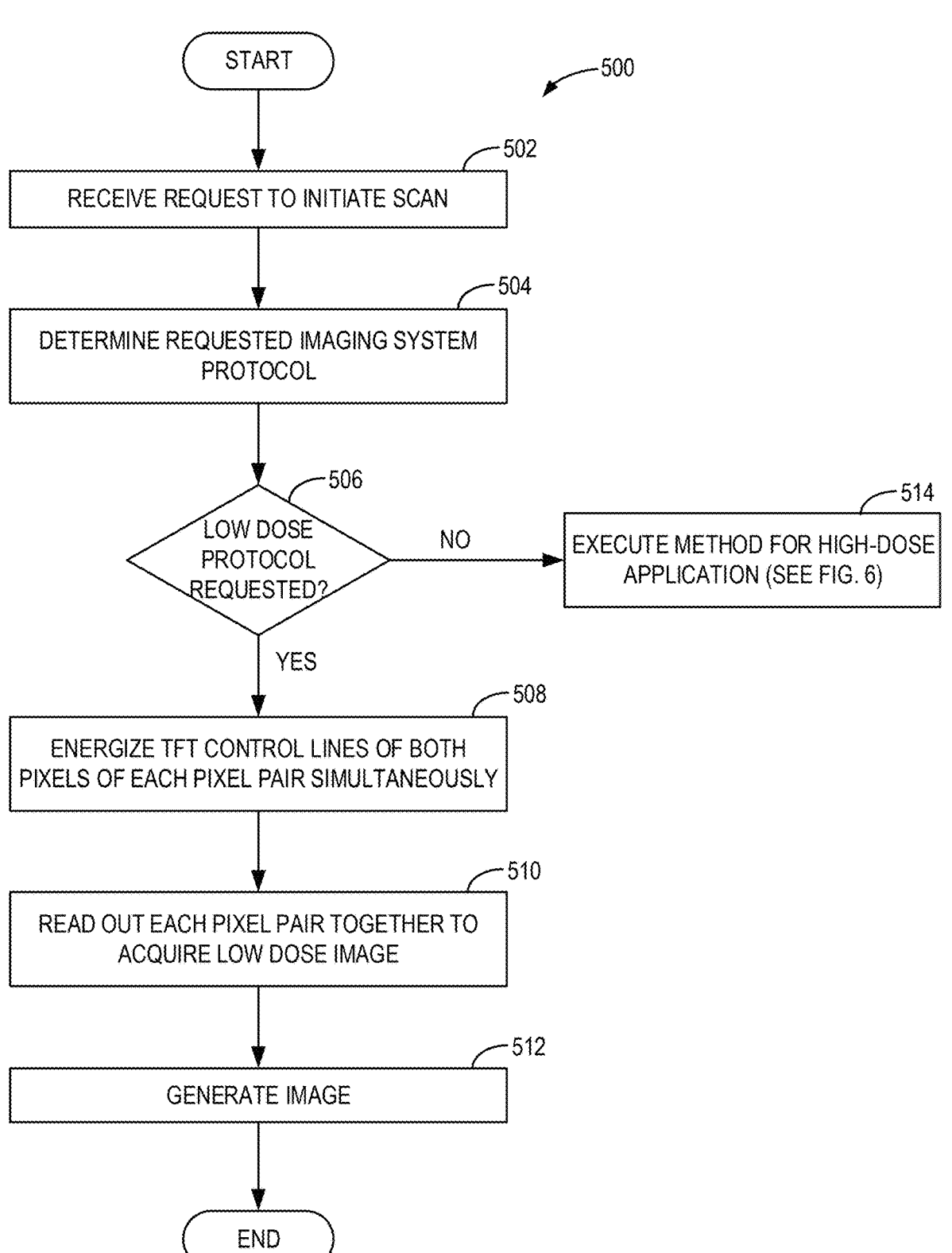
FIG. 5 shows a flowchart illustrating a method for generating a low-dose x-ray image, according to an embodiment.
Figure 6:
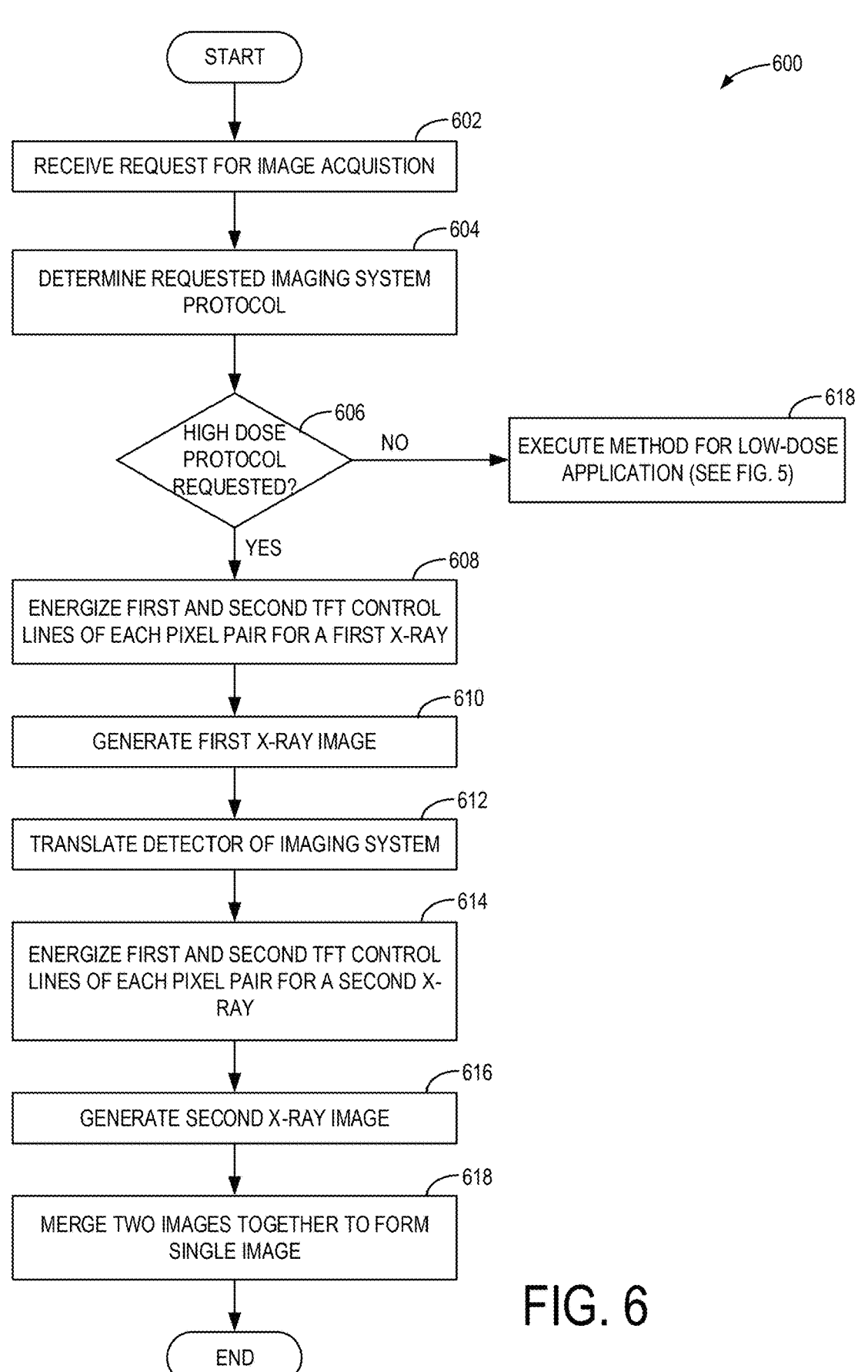
FIG. 6 shows a flowchart illustrating a method for generating a high-dose x-ray image, according to an embodiment.

The following description relates to various embodiments of medical imaging. In particular, systems and methods for an x-ray detector with rectangular pixels are provided. An example of an x-ray system is shown in FIGS. 1 and 2. The exemplary x-ray system as shown in FIGS. 1 and 2 is a mammography system, though it should be understood that other x-ray based systems may also apply without departing from the scope of this disclosure, such as computed tomography (CT) systems and the like. A diagram of a pair of rectangular pixels, in accordance with the present disclosure, is shown in FIG. 3. A schematic of x-ray detector positioning with relation to the pair of rectangular pixels is shown in FIG. 4. Methods for operating the x-ray machine to acquire a low-dose x-ray image and a high-dose x-ray image are illustrated in FIGS. 5 and 6.

Current flat panel x-ray detectors, such as those used in mammography, CT, and other types of medical imaging, utilize x-ray detectors with pixel arrays. Pixel size is a static fixture, for example 100 micrometers ($\mu m$) by 100 $\mu m$ or 50 $\mu m$ by 50 $\mu m$. However, pixel size affects spatial resolution and signal-to-noise ratio. For example, high-dose application images may have lower spatial resolution when the detector array comprises larger pixels (e.g., 100×100 $\mu m$ pixels) and high spatial resolution when the detector array comprises smaller pixels (e.g., 50×50 $\mu m$). However, low-dose application images may have lower signal-to-noise ratio when the detector array comprises smaller pixels and higher signal-to-noise ratio when the detector array comprises larger pixels. As such, a large pixel size (e.g., 100×100 $\mu m$) may be preferred for low-dose applications but spatial resolution may suffer in high-dose applications with the large size. Thus a small pixel size (e.g., 50×50 $\mu m$) may be preferred for high-dose applications but signal-to-noise ratio may suffer in low-dose applications with small pixel size. To overcome this, high-dose applications and low-dose applications may be performed on separate imaging systems. However, this is inconvenient for hospital systems, both for scheduling of imaging studies and in footprint.

In addition, a widely used photodiode for x-ray imaging is amorphous Silicon (a-Si). However, a-Si photodiodes may be used with detector arrays with a minimum pixel size of approximately 75×75 μm. Thus, manufacture of a-Si photodiodes does not allow for smaller pixel sizes, such as 50×50 μm. However, other photodiodes that can be used with detector arrays with smaller pixel sizes, such as complementary metal-oxide-semiconductors (CMOS), are less accessible and/or less cost effective.

Thus, methods and systems are provided herein for an x-ray system that at least partially addresses these issues, wherein the x-ray system comprises rectangular x-ray detector pixels arranged in pairs. For example, the pixel may have a first dimension (e.g., a height) of 100 μm and a second dimension (e.g., a width) of 50 μm. When in use for a low-dose application, pairs of adjacent rectangular pixels may be energized simultaneously and may be read out together. Thus, the pair of rectangular pixels may be read out as one with an effect larger (e.g., 100×100 μm) pixel size to generate a single image. Thus, the rectangular pixels provide for high signal-to-noise ratio in the low-dose application. When in use for a high-dose application, pixels in rectangular pixel pairs may be energized sequentially and read out individually to generate two images with rectangular pixels (e.g., 100×50 μm). Additionally, the detector may be translated by 50 μm along the first dimension such that the two generated images have a 50 μm positioning difference. The two images are then combined into one image with an effective small pixel size (e.g., 50×50 μm) using image processing techniques. In this way, with a single x-ray system pixel size can be optimized for both low-dose applications and high-dose applications. Further, the rectangular pixels may be of a size compatible with a-Si photodiodes, providing for more accessible manufacturing.

Referring to FIG. 1, a digital mammography system 100 including an x-ray system 10 for performing a mammography procedure is shown, according to an embodiment of the disclosure. The x-ray system 10 may be a used to acquire one or more types of images during one or more acquisitions. It should be appreciated that the digital mammography system 100 described with respect to FIG. 1 is an example of an x-ray imaging system and other types of x-ray imaging systems that use flat panel detectors, such as CT systems and the like, are also applicable.

The x-ray system 10 includes a support structure 42, to which a radiation source 16, a radiation detector 18, and a collimator 20 are attached. The radiation source 16 is housed within a gantry 15 that is movably coupled to the support structure 42. In particular, the gantry 15 may be mounted to the support structure 42 such that the gantry 15 including the radiation source 16 can rotate around an axis 58 in relation to the radiation detector 18. An angular range of rotation of the gantry 15 housing the radiation source 16 indicates a rotation up to a desired degree in either direction about the axis 58. For example, the angular range of rotation of the radiation source 16 may be −0 to +0, where 0 may be such that the angular range is a limited angle range, less than 360 degrees. An exemplary x-ray system may have an angular range of +11 degrees, which may allow rotation of the gantry (that is rotation of the radiation source) from −11 degrees to +11 degrees about an axis of rotation of the gantry. The angular range may vary depending on the manufacturing specifications. The angular range for digital mammography systems may be approximately +11 degrees to +60 degrees, depending on the manufacturing specifications.

The radiation source 16 is directed toward a volume or object to be imaged and is configured to emit radiation rays at desired times to acquire one or more images. The radiation detector 18 is configured to receive the radiation rays via a surface 24. The detector 18 may be any a flat panel detector. The detector 18 may comprise a photosensor pixel array that is optically coupled to a scintillator (e.g., of the surface 24). The scintillator may be disposed to receive incident radiation rays, such as x-rays. Optical photons generated in the scintillator in response to the incident radiation pass to the photosensor pixel array in which the light is detected and corresponding image data signals are generated by the photosensors in the array. The collimator 20 is disposed adjacent to the radiation source 16 and is configured to adjust an irradiated zone of a subject. Further, the detector 18 may be configured to translate linearly using a fast piezoelectric linear actuator.

In some embodiments, the system 10 may further include a patient shield 36 mounted to the radiation source 16 via face shield rails 38 such that a patient's body part (e.g., head) is not directly under the radiation. The system 10 may further include a compression paddle 40, which may be movable upward and downward in relation to the support structure along a vertical axis 60. Thus, the compression paddle 40 may be adjusted to be positioned closer to the radiation detector 18 by moving the compression paddle 40 downward toward the detector 18, and a distance between the detector 18 and the compression paddle 40 may be increased by moving the compression paddle upward along the vertical axis 60 away from the detector. The movement of the compression paddle 40 may be adjusted by a user via compression paddle actuator (not shown) included in the x-ray system 10. The compression paddle 40 may hold a body part, such as a breast, in place against the surface 24 of the radiation detector 18. The compression paddle 40 may compress the body part and hold the body part still in place while optionally providing apertures to allow for insertion of a biopsy needle, such as a core needle or a vacuum assisted core needle. In this way, compression paddle 40 may be utilized to compress the body part to minimize the thickness traversed by the x-rays and to help reduce movement of the body part due to the patient moving. The x-ray system 10 may also include an object support (not shown) on which the body part may be positioned.

The digital mammography system 100 may further include a workstation 43, as further shown in FIG. 2. The workstation 43 may comprise a controller 44 including at least one processor and a memory. The controller 44 may be communicatively coupled to one or more components of the x-ray system 10 including one or more of the radiation source 16, radiation detector 18, the compression paddle 40, and a biopsy device. In some examples, the communication between the controller and the x-ray system 10 may be via a wireless communication system. In other examples, the controller 44 may be in electrical communication with the one or more components of the x-ray system via a cable 47. Further, in an exemplary embodiment, as shown in FIG. 2, the controller 44 is integrated into the workstation 43. In other embodiments, the controller 44 may be integrated into one or more of the various components of the system 10 disclosed above. Further, the controller 44 may include processing circuitry that executes stored program logic and may be any one of different computers, processors, controllers, or combination thereof that are available for and compatible with the various types of equipment and devices used in the x-ray system 10.

The workstation 43 may include a radiation shield 48 that protects an operator of the system 10 from the radiation rays emitted by the radiation source 16. The workstation 43 may further include a display 50, a keyboard 52, mouse 54, and/or other appropriate user input devices that facilitate control of the system 10 via a user interface 56.

The controller 44 may adjust the operation and function of the x-ray system 10. As an example, the controller 44 may provide timing control, as to when the x-ray source 16 emits x-rays, and may further adjust how the detector 18 reads and conveys information or signals after the x-rays hit the detector 18, and how the x-ray source 16 and the detector 18 move relative to one another and relative to the body part being imaged. The controller 44 may also control how information, including images 42 and data acquired during the operation, is processed, displayed, stored, and manipulated. Various method steps as described herein with respect to FIGS. 5-6 performed by the controller 44, may be provided by a set of instructions stored in non-transitory memory of the controller 44.

Further, as stated above, the radiation detector 18 receives the radiation rays emitted by the radiation source 16. In particular, during imaging with the x-ray system, a projection image of the imaging body part may be obtained at the detector 18. In some embodiments, data, such as projection image data, received by the radiation detector 18 may be electrically and/or wirelessly communicated to the controller 44 from the radiation detector 18. The controller 44 may then reconstruct one or more scan images based on the projection image data, by implementing a reconstruction algorithm, for example. The reconstructed image may be displayed to the user on the user interface 50 via a display screen 56.

The radiation source 16, along with the radiation detector 18, forms part of the x-ray system 10 which provides x-ray imagery for the purpose of one or more of screening for abnormalities, diagnosis, dynamic imaging, and image-guided biopsy. For example, the x-ray system 10 may be operated in a mammography mode for screening for abnormalities. During mammography, a patient's breast is positioned and compressed between the detector 18 and the compression paddle 40. Thus, a volume of the x-ray system 10 between the compression paddle 40 and the detector 18 is an imaging volume. The radiation source 16 then emits radiation rays on to the compressed breast, and a projection image of the breast is formed on the detector 18. The projection image may then be reconstructed by the controller 44, and displayed on the interface 50. During mammography, the gantry 15 may be adjusted at different angles to obtain images at different orientations, such as a cranio-caudal (CC) image and a medio-lateral oblique (MLO) image. In one example, the gantry 15 may be rotated about the axis 58 while the compression paddle 40 and the detector 18 remain stationary. In other examples, the gantry 15, the compression paddle 40, and the detector 18 may be rotated as a single unit about the axis 58.

Further, the x-ray system 10 may be operated in a tomo-synthesis mode for performing digital breast tomosynthesis (DBT). During tomosynthesis, the x-ray system 10 may be operated to direct low-dose radiation towards the imaging volume (between the compression paddle 40 and the detector 18) at various angles over the angular range of the x-ray system 10. Specifically, during tomosynthesis, similar to mammography, the breast is compressed between the compression paddle 40 and the detector 18. The radiation source 16 is then rotated from −0 to +0, and a plurality of projection images of the compressed breast is obtained at regular angular intervals over the angular range. For example, if the angular range of the x-ray system is +11 degrees, 22 projection images may be captured by the detector during an angular sweep of the gantry at approximately one every one degree, generating a set of angulated x-ray images. The plurality of projection images are then processed by the controller 44 to generate a plurality of DBT image slices. The processing may include applying one or more reconstruction algorithms to reconstruct three dimensional image of the breast. Furthermore, the x-ray system may be configured to perform a DBT-guided biopsy procedure. Accordingly, in some exemplary embodiments, the system 10 may further include a biopsy device comprising a biopsy needle for extracting a tissue sample for further analysis.

In some examples, digital mammography system 100 may be configured to perform contrast imaging where contrast agents, such as iodine, can be injected into the patient and travel to the ROI within the breast (e.g., a lesion). The contrast agents are taken up in the blood vessels surrounding a cancerous lesion in the ROI, thereby providing a contrasting image for a period of time with respect to the surrounding tissue, enhancing the ability to locate the lesion.

In some embodiments, the digital mammography system 100 includes, or is coupled to, a picture archiving and communications system (PACS). In an exemplary implementation, the PACS is further coupled to a remote system such as a radiology department information system, hospital information system, and/or to an internal or external network (not shown) to allow operators at different locations to supply commands and parameters and/or gain access to the image data.

In some examples, images reconstructed by the controller 44 may store the images reconstructed in a storage device. Alternatively, the images may transmitted for generating useful patient information for diagnosis and evaluation. In certain embodiments, the controller 44 may transmit the reconstructed images and/or the patient information to the display 50. In some embodiments, the reconstructed images may be transmitted from the controller 44 to the storage device for short-term or long-term storage.

The various methods and processes (such as the method described below with reference to FIGS. 5 and 6) described further herein may be stored as executable instructions in non-transitory memory on a computing device (or controller) in the imaging system (e.g., digital mammography system 100). In one embodiment, the controller 44 may include such executable instructions in non-transitory memory, and may apply the methods described herein to reconstruct an image from scanning data. Further, the methods herein described for reading out pixels and merging images may be stored and executed by the controller 44.

It should be understood that while a digital mammography system is herein described in FIGS. 1 and 2, other x-ray systems that use flat panel detectors, such as CT imaging systems, x-ray systems, fluoroscopy systems, interventional radiology systems, and the like, may also apply without departing from the scope of this disclosure.

Turning now to FIG. 3, a schematic of a photosensor pixel pair 300 of an x-ray system comprising a detector is shown. The photosensor pixel pair 300 may be one of a plurality of photosensor pixel pairs in a photosensor pixel array, such as the photosensor pixel array of the detector 18 of FIGS. 1-2. As noted, the photosensor array may comprise a plurality of photosensor pixels, each of the photosensor pixels may be rectangular pixels. The pixels may be arranged in pairs of adjacent pixels. In some examples, the pairs may be predefined and known by the system. In other examples, the pairs may be flexible so as to change which pixels comprise a pair depending on application and use. The pixels in the array may be arranged in rows and columns, typically in an N×M matrix arrangement, with each photosensor being connected to an address line and a scan line to allow charged developed in each respective photosensor in response to incident light to be read.

Each pixel in the photosensor pixel array may comprise a thin film transistor (TFT) (e.g., field effect transistor), a TFT control line, a data read out line, a common voltage line, and one or more photodiodes (e.g., light sensitive p-i-n photodiodes). For example, the photosensor pixel pair 300 may comprise a first pixel 302 and a second pixel 304. The first pixel may comprise a first TFT 312, a first TFT control line 320, a first data read out line 324, a first common voltage line 328, and first photodiode(s) 316. The second pixel 304 may comprise a second TFT 314, a second TCT control line 322, a second data read out line 324, a second common voltage line 330, and second photodiode(s) 318. The first and second TFTs 312, 314 may act as switches to individually turn each pixel "on" or "off". The first and second TFT control lines 320, 322 may be energized or denergized to switch on or off the respective TFTs, which may allow the photodiodes to be read out one at a time or simultaneously, depending on application. The components of each of the pixel as herein described may allow each pixel to generate a respective image data signal.

Each of the first and second pixels 302, 304 may have a first dimension 310. The first dimension 310 in some examples may be a pixel height, or vertical dimension, as is shown in FIG. 3. However, in other examples, the first dimension 310 may be a width, or horizontal dimension. The first pixel 302 may have a second dimension 306 that is perpendicular to the first dimension 310. The second pixel 304 may also have a corresponding second dimension 308 that is perpendicular to the first dimension 310. The second dimension 306 of the first pixel 302 and the second dimension 308 of the second pixel 304 may be equal in length and either may be considered the second dimension of any pixel of the detector array.

In some examples, the second dimensions 306, 308 may be half the length of the first dimension 310. As an example, the first dimension 310 may be 100 μm and the second dimensions 306, 308 may each be 50 μm, such that each of the first and second pixels 302, 304 are 50×100 μm. Thus, the pixels may be rectangular pixels and the pixel pair may be a square or approximately a square. It should be appreciated that other dimensions may be possible without departing from the scope of this disclosure.

The first and second pixels 302, 304 of the photosensor pixel pair 300 may be directly adjacent to each other when arranged in the matrix of pixels. As will be described with respect to FIGS. 5 and 6, the first and second TFT control lines 320, 322 may be energized simultaneously or sequentially depending on whether a chosen application is low-dose or high-dose. For example, in low-dose applications, the control lines may be energized simultaneously and thus photosensor pixel pair 300 may be read out together by the data read out lines 324, 326 to form one image with an overall pixel size of the first dimension 310 by the second dimension 306 plus the second dimension 308 (e.g., for an overall pixel size of 100×100 μm). In high-dose applications, the control lines may be energized sequentially and thus the first and second pixels 302, 304 may be read out separately by the data read out lines 324, 326. Additionally, as will be further explained with respect to FIG. 4 below, in high-dose applications, the detector may be translated by half the first dimension 310 (e.g., by 50 μm when the first dimension 310 is 100 μm). Energizing the two control lines of the pair sequentially and translating the detector may thus generate two images with pixels that overlap by 50 μm.

With rectangular pixels with a pitch of 50×100 μm, an area of the photodiodes may be compatible with a-Si. For example, a minimum area of a pixel that can be used with a-Si photodiodes may be approximately 5000 μm$^2$, in some examples. The rectangular pixels of pixel pitch 50×100 μm as herein presented may have an area of 5000 μm$^2$, which may be compatible with the a-Si photodiodes. Thus, the rectangular pixels may allow for high image quality in both low-dose and high-dose applications while allowing the accessible a-Si photodiodes to be used during manufacturing.

Turning now to FIG. 4, a schematic 400 of detector position with respect to the photosensor pixel pair 300 of FIG. 3 is shown. The photosensor pixel pair 300 may comprise the first pixel 302 and the second pixel 304, as previously described. The first and second pixels 302, 304 may be symmetric rectangular pixels with dimensions as previously described. As a non-limiting example, the pixels may have dimensions of 100×50 μm.

The schematic 400 shows a first position 402 of the detector and a second position 404 of the detector in high-dose applications. As previously described, the photosensor pixel pair 300 is a representative pixel pair of a plurality of pixel pairs that make up a pixel array. The dashed lines of the first position 402 and second position 404 of the detector may represent the spatial extent of the pixel pair that is imaged by the system with the detector in the given position and is not meant to describe a shape or actual dimension of the detector.

The pixel array may comprise a matrix of pixel pairs, as described above. The first position 402 of the detector may image the matrix of pixel pairs in the first position. The second position 404 may be a translation of the detector by half the length of the first dimension 310 of the pixel pair 300. For example, the second position 404 may be a first distance 406 translated from the first position 402, the first distance 406 being half the first dimension 310. As an example, when the first dimension 310 is 100 μm, the first distance 406 may be 50 μm.

As will be further described below, in high-dose applications, two images are generated and the detector is translated by the first distance 406 between the two images. As such, with each pixel of the pixel pair 300 being read out individually for each image, two images with rectangular pixel dimensions may be generated. The two images may have overlapping data and, using one or more image processing techniques, may be merged together to form one image with pixels having dimensions of half the first dimension 310 by the second dimension (e.g., second dimension 306 and/or 308). For example, with rectangular pixels of 100×50 μm, generating two images and translating the detector by 50 μm along the 100 μm dimension may result in an effective pixel pitch of 50×50 μm.

Turning now to FIG. 5, a flowchart illustrating a method 500 for generating an x-ray based image of a patient is shown for a low-dose application. The method 500 may be carried out using the systems and components described herein above with regards to FIGS. 1-3, however it should be understood that similar methods may be used with other systems without departing from the scope of this disclosure. The method 500 may be carried out via instructions stored in non-transitory memory of one or more computing devices. For example, instructions may be stored in memory and executed by one or more processors of the controller 44 of FIG. 1. The method 500 is described with respect to rectangular pixels with 50×100 μm dimensions, however it should be understood that other rectangular pixel dimensions may be used without departing from the scope of this disclosure.

At 502, method 500 includes receiving a request to initiate a scan of the patient. The request may be a user selection or other user input inputted by a user via a user device (e.g., via operator console of workstation 43 of FIG. 1) in communication with an imaging system (e.g., x-ray system 10 of FIG. 1). The imaging system may comprise a detector with a photosensor pixel array comprising a matrix of rectangular pixels partitioned into a plurality of pixel pairs, as described with respect to FIG. 3. Each of the rectangular pixels may comprise a TFT and a TFT control line.

At 504, method 500 includes determining a requested imaging system protocol. For example, the request may indicate type of scan, scanning protocol, and other parameters which may indicate to the imaging system requested views, requested irradiation amounts, and the like. As a non-limiting example, scanning protocol for mammography applications may include 2D mammogram protocol, 3D mammogram protocol, and 3D tomosynthesis protocol, each of which may demand different imaging set ups, amounts of irradiation, and the like.

At 506, method 500 determines whether a low-dose protocol is requested. As an example, the requested imaging system protocol as determined at 504 may indicate an amount of irradiation to be delivered to the patient when acquiring the images. In some examples, the imaging system may include threshold radiation amounts, where if the requested protocol demands an amount of irradiation below the threshold, the protocol may be low-dose and if the requested protocol demands an amount of irradiation above the threshold, the protocol may be high-dose. In other examples, each imaging protocol known to the system may be designated as either low-dose or high-dose. For example, screening examination protocols, such as a screening mammogram or a screening chest CT may be pre-defined as low-dose. If the requested protocol is low-dose, method 500 proceeds to 508. If the requested protocol is not low-dose (e.g., high-dose), method 500 proceeds to 514 to execute method for high-dose applications, as will be further described with respect to FIG. 6.

At 508, method 500 includes energizing the TFT control lines of each pixel pair simultaneously. As noted above, the photosensor pixel array of the detector may comprise a plurality of pairs of rectangular pixels, each of the pixels in each pair of pixels comprising a TFT and a TCT control line configured to switch the pixel on and off. The TFT control lines of each pixel pair may be energized at the same time such that the pair of pixels may be considered as one pixel.

At 510, method 500 includes reading out each pixel pair together. Reading out the pixel pairs may generate imaging data signals for each pixel pair. Each of the rectangular pixels may be 50×100 μm. Reading out the pixel pairs together may result in an effective pixel pitch of 100×100 μm. Thus, the effective pixel pitch in low-dose applications may be twice the rectangular pixel pitch.

At 512, method 500 includes generating the image with the effective pixel pitch resultant from reading out each pixel pair together. With the effective pixel pitch of 100×100 μm, which may be a relatively large pixel pitch, the low-dose acquisition may have a high signal-to-noise ratio and increased image quality.

Turning now to FIG. 6, a flowchart illustrating a method 600 for generating an x-ray based image of a patient is shown for a high-dose application. The method 600 may be carried out using the systems and components described herein above with regards to FIGS. 1-3, however it should be understood that similar methods may be used with other systems without departing from the scope of this disclosure. The method 600 may be carried out via instructions stored in non-transitory memory of one or more computing devices. For example, instructions may be stored in memory and executed by one or more processors of the controller 44 of FIG. 1.

At 602, method 600 includes receiving a request to initiate a scan of the patient. The request may be a user selection or other user input inputted by a user via a user device (e.g., via operator console of workstation 43 of FIG. 1) in communication with an imaging system (e.g., x-ray system 10 of FIG. 1). The imaging system may comprise a detector with a photosensor pixel array comprising a matrix of rectangular pixels partitioned into a plurality of pixel pairs, as described with respect to FIG. 3. Each of the rectangular pixels may comprise a TFT and a TFT control line.

At 604, method 600 includes determining a requested imaging system protocol. For example, the request may indicate type of scan, scanning protocol, and other parameters which may indicate to the imaging system requested views, requested irradiation amounts, and the like. As a non-limiting example, scanning protocol for mammography applications may include 2D mammogram protocol, 3D mammogram protocol, and 3D tomosynthesis protocol, each of which may demand different imaging set ups, amounts of irradiation, and the like.

At 606, method 600 determines whether a high-dose protocol is requested. As an example, the requested imaging system protocol as determined at 604 may indicate an amount of irradiation to be delivered to the patient when acquiring the images. In some examples, the imaging system may include threshold radiation amounts, where if the requested protocol demands an amount of irradiation below the threshold, the protocol may be low-dose and if the requested protocol demands an amount of irradiation above the threshold, the protocol may be high-dose. In other examples, each imaging protocol known to the system may be designated as either low-dose or high-dose. For example, diagnostic examination protocols, such as a diagnostic mammogram may be pre-defined as low-dose. If the requested protocol is low-dose, method 600 proceeds to 608. If the requested protocol is not low-dose (e.g., high-dose), method 600 proceeds to 618 to execute method for low-dose applications, as described with respect to FIG. 5.

At 608, method 600 includes energizing first and second TFT control lines of each pixel pair for a first x-ray. Energizing TFT control lines sequentially, as described above, may comprise energizing the first TFT control line at a first time and energizing the second TFT control line at a second time. The energization for the first x-ray as at 608 may be energization at the first time.

At 610, method 600 includes generating a first x-ray image. The first x-ray image may correspond to a first position of the detector prior to translation of the detector. The first x-ray image may include data of the pixels with the detector at the first position. The pixels, as energized, may be rectangular, for example 50×100 μm in size.

At 612, method 600 includes translating the detector of the imaging system. For 100×50 μm rectangular pixels, the detector may be translated by 50 μm along the 100 μm dimension. For example, the rectangular pixels may have a vertical dimension of 100 μm and a horizontal dimension of 50 μm. In such an example, the detector may be translated by 50 μm along the vertical direction. In some examples, the detector may be translated using a fast piezoelectric linear actuator.

In some examples, a pulse of x-rays emitted from an x-ray source to be detected by the x-ray detector may be split into two halves. In such examples, the detector may be translated in the interim between the two halves of the pulse when the x-ray system is stopped (e.g., not actively emitting radiation rays), thereby resulting in no blur in the generated images. Alternatively, the detector may be translated during the pulse without splitting the x-ray pulse. For example the detector may be translated over a duration of 50 milliseconds, resulting in an overall blur of 5% for a 1 second acquisition.

At 614, method 600 includes energizing first and second TFT control lines of each pixel pair for a second x-ray. Energizing TFT control lines sequentially, as described above, may comprise energizing the first TFT control line at a first time and energizing the second TFT control line at a second time. The energization for the second x-ray as at 614 may be energization at the second time. The pixels during energization at the second time may also be the rectangular pixel size, for example 50×100 μm.

At 616, method 600 includes generating a second x-ray image. The second x-ray image may correspond to the second position of the detector prior to translation of the detector. The second x-ray image may include data of the pixels with the detector at the second position. The pixels, as energized, may be rectangular, for example 50×100 μm in size.

Generating the first and second images may include reading out each pixel of each pixel pair individually. As each pixel comprise a data read out line, each pixel may be read out on its own. Each of the rectangular pixels may be 50×100 μm. Reading out the pixel pairs separately may result in a maintained pixel pitch of 50×100 μm. Reading out the pixels individually may thus result in generating of two imaging data signals per pixel pair, one imaging data signal for each of the pixels in the pair. Further, as the detector is translated, as described above, each pixel may be read out twice, and thus each pixel may generate two image data signals thereof, one signal for each pixel in each image. The first and second images may comprise data of the same pixels and may thus be considered over-sampled images. In examples in which the x-ray pulse is split into two, the first image may correspond to a first half of the x-ray pulse and the second image may correspond to a second half of the x-ray pulse.

At 618, method 600 includes merging the two images together to form a single image. The single image may have an effective pixel pitch of 50×50 μm, which may be half the rectangular pixel pitch of 50×100 μm. Merging the two images may be accomplished via one or more image processing techniques, such as inverse filtering (e.g., deblurring) and/or noise regularization (e.g., to reduce noise enhancements when signal-to-noise ratio is too small).

As an example, a filter may be applied to the images. The filter may be a finite impulse response filter in which the filter's desired frequency characteristics are determined from information about the imaging system. The filter may comprise an inverse filtering portion and a noise regularization portion which is controlled by a single parameter. The inverse filtering may invert the effect of blurring in the image acquisition data, such as from the scintillator and the aperture. The blurring may be modeled as a linear shift-invariant process and may be expressed as a convolution of the original image with the blurring function. The regularization portion of the filter may decrease the response of the filter as the frequency increase to prevent noise enhancement in the low signal-to-noise ratio regions. It should be understood that the method for merging and processing the images as herein presented is a non-limiting example and other suitable methods for merging and processing may be used without departing from the scope of this disclosure.

The image resultant from combining the two images may have an effective pixel pitch of 50×50 μm, as noted. The effective pixel pitch of 50×50 μm may thus be half the rectangular pixel pitch of 50×100 μm. In this way, the rectangular pixels herein disclosed may provide for a smaller pixel size in high-dose applications. With smaller pixel sizes like 50×50 μm, the high-dose applications may generate images with high spatial resolution.

The technical effect of the systems and methods herein presented is that rectangular pixels may be used to generate pixels of a smaller size in high-dose applications, thereby allowing for high spatial resolution therein, as well as generate pixels of a larger size in low-dose applications, thereby allowing for high signal-to-noise ratio therein. Thus, a single x-ray system that incorporates rectangular pixels as herein described may be used both for low-dose and high-dose imaging applications. As a use-case example, mammography imaging may be high-dose or low-dose depending on end use. For example, 3D mammography imaging may be a high-dose application while screening images, like 2D and/or tomosynthesis mammography, may be a low-dose applications. With the rectangular pixel detector array herein presented, applications with different dose amounts may be acquired using the same imaging system. Further, the rectangular pixels as herein described, may accommodate a-Si photodiodes, which may increase efficiency of manufacture of the imaging system capable of generating high quality images in high-dose applications.

The disclosure also provides support for an x-ray imaging system, comprising: a photosensor pixel array of a flat panel detector comprising a plurality of pixels with a rectangular pixel pitch, wherein the plurality of pixels are arranged in pairs and each of the plurality of pixels is configured to generate respective image data signals via a thin film transistor (TFT), a TFT control line, and a data read out line, wherein in low-dose applications, TFT control lines of pixels in each pixel pair are energized simultaneously to generate the respective image data signals with a first effective pixel pitch of twice the rectangular pixel pitch and in high-dose applications, TFT control lines of pixels in each pixel pair are energized sequentially to generate the respective image data signals with the rectangular pixel pitch, and a controller coupled to said photosensor pixel array so as to receive the respective image data signals generated by the plurality of pixels, wherein, in the high-dose applications, the controller is configured to translate the flat panel detector between a first position and a second position to generate two image data signals for each pixel of the plurality of pixels and the controller is configured to combine the two image data signals to generate image data signals with a second effective pixel pitch of half the rectangular pixel pitch. In a first example of the system, the rectangular pixel pitch is 50×100 μm, the first effective pixel pitch in low-dose applications is 100×100 μm, and the second effective pixel pitch in high-dose applications is 50×50 μm. In a second example of the system, optionally including the first example in high-dose applications, a first image is generated with the flat panel detector in the first position and a second image is generated with the detector in the second position. In a third example of the system, optionally including one or both of the first and second examples, the flat panel detector is configured to translate 50 μm between the first and second positions along the 100 μm dimension of the plurality of pixels in high-dose applications. In a fourth example of the system, optionally including one or more or each of the first through third examples, the controller is configured with one or more of an inverse filter and a noise regularization filter stored in memory that when executed combine the two image data signals in high-dose applications. In a fifth example of the system, optionally including one or more or each of the first through fourth examples, each pixel of the plurality of pixels includes an amorphous Silicon (a-Si) photodiode. In a sixth example of the system, optionally including one or more or each of the first through fifth examples, the x-ray imaging system is configured as a mammography imaging system and wherein the low-dose applications comprise tomosynthesis applications and the high-dose applications comprise three-dimensional (3D) applications.

The disclosure also provides support for a method, comprising: determining an imaging system protocol of a requested scan, in response to determination the imaging system protocol, energizing thin film transistor (TFT) control lines of rectangular pixels in each pair of rectangular pixels in a pixel array of a detector one of simultaneously and sequentially, wherein TFT control lines are energized simultaneously in low-dose protocols and sequentially in high-dose protocols, generating imaging data signals, wherein the imaging data signals comprise an imaging data signal for each pair when the TFT control lines of each pair are energized simultaneously and two imaging data signals for each pair when the TFT control lines of each pair are energized sequentially. In a first example of the method, the rectangular pixels have a pixel pitch of 50×100 μm. In a second example of the method, optionally including the first example, generating imaging data signals in low-dose protocols comprises reading out pixel pairs together for an effective pixel pitch of 100×100 μm. In a third example of the method, optionally including one or both of the first and second examples, generating imaging data signals in low-dose protocols comprises reading out rectangular pixels of each pair individually at the pixel pitch of 50×100 μm. In a fourth example of the method, optionally including one or more or each of the first through third examples, the method further comprises: when the imaging system protocol is a high-dose protocol: translating the detector by 50 μm along a first direction, generating two images from the read-out rectangular pixels at the pixel pitch of 50×100 μm, and combining the two images into one image, wherein the one image has an effective pixel pitch of 50×50 μm. In a fifth example of the method, optionally including one or more or each of the first through fourth examples, combining the two images into one image comprises applying one or more of an inverse filter and a noise regularization filter.

The disclosure also provides support for an imaging system, comprising: an x-ray detector comprising a matrix of rectangular pixel pairs, wherein each pixel in each pixel pair comprises a thin film transistor (TFT), a TFT control line, and a data read out line, wherein each pixel of each rectangular pixel pair is configured with a first dimension and a second dimension, the second dimension being half a length of the first dimension. In a first example of the system, each pixel of each rectangular pixel pair has a pixel pitch of 50×100 μm, wherein the first dimension is 100 μm and the second dimension is 50 μm. In a second example of the system, optionally including the first example, the TFT control line of each pixel in each rectangular pixel pair is energized simultaneously in low-dose applications. In a third example of the system, optionally including one or both of the first and second examples, the TFT control line of each pixel in each rectangular pixel pair is energized sequentially in high-dose applications. In a fourth example of the system, optionally including one or more or each of the first through third examples, the x-ray detector is configured to translate half the length of the first dimension along a direction of the first dimension. In a fifth example of the system, optionally including one or more or each of the first through fourth examples, the x-ray detector is configured to receive radiation rays from a radiation source emitting a pulse the radiation rays, wherein in high-dose applications, the radiation source is configured to split the pulse of the radiation rays in two halves and wherein the x-ray detector is configured translate the half the length of the first dimension along the direction of the first dimension between the two halves of the pulse. In a sixth example of the system, optionally including one or more or each of the first through fifth examples, the x-ray detector is configured to receive radiation rays from a radiation source emitting a pulse of the radiation rays, wherein in high-dose applications, the x-ray detector is configured to translate the half the length of the first dimension along the direction of the first dimension during the pulse of the radiation rays.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. An x-ray imaging system, comprising:
   a photosensor pixel array of a flat panel detector comprising a plurality of pixels with a rectangular pixel pitch, wherein the plurality of pixels are arranged in pairs and each of the plurality of pixels is configured to generate respective image data signals via a thin film transistor (TFT), a TFT control line, and a data read out line, wherein in low-dose applications, TFT control lines of pixels in each pixel pair are energized simultaneously to generate the respective image data signals with a first effective pixel pitch of twice the rectangular pixel pitch and in high-dose applications, TFT control lines of pixels in each pixel pair are energized sequentially to generate the respective image data signals with the rectangular pixel pitch; and a controller coupled to said photosensor pixel array so as to receive the respective image data signals generated by the plurality of pixels, wherein, in the high-dose applications, the controller is configured to translate the flat panel detector between a first position and a second position to generate two image data signals for each pixel of the plurality of pixels and the controller is configured to combine the two image data signals to generate image data signals with a second effective pixel pitch of half the rectangular pixel pitch.

2. The x-ray imaging system of claim 1, wherein the rectangular pixel pitch is 50×100 µm, the first effective pixel pitch in low-dose applications is 100×100 µm, and the second effective pixel pitch in high-dose applications is 50×50 µm.

3. The x-ray imaging system of claim 1, wherein, in high-dose applications, a first image is generated with the flat panel detector in the first position and a second image is generated with the detector in the second position.

4. The x-ray imaging system of claim 1, wherein the flat panel detector is configured to translate 50 µm between the first and second positions along the 100 µm dimension of the plurality of pixels in high-dose applications.

5. The x-ray imaging system of claim 1, wherein the controller is configured with one or more of an inverse filter and a noise regularization filter stored in memory that when executed combine the two image data signals in high-dose applications.

6. The x-ray imaging system of claim 1, wherein each pixel of the plurality of pixels includes an amorphous Silicon (a-Si) photodiode.

7. The x-ray imaging system of claim 1, wherein the x-ray imaging system is configured as a mammography imaging system and wherein the low-dose applications comprise tomosynthesis applications and the high-dose applications comprise three-dimensional (3D) applications.

8. A method, comprising:

determining an imaging system protocol of a requested scan;

in response to determination the imaging system protocol, energizing thin film transistor (TFT) control lines of rectangular pixels in each pair of rectangular pixels in a pixel array of a detector one of simultaneously and sequentially, wherein TFT control lines are energized simultaneously in low-dose protocols and sequentially in high-dose protocols;

generating imaging data signals, wherein the imaging data signals comprise an imaging data signal for each pair when the TFT control lines of each pair are energized simultaneously and two imaging data signals for each pair when the TFT control lines of each pair are energized sequentially.

9. The method of claim 8, wherein the rectangular pixels have a pixel pitch of 50×100 µm.

10. The method of claim 9, wherein generating imaging data signals in low-dose protocols comprises reading out pixel pairs together for an effective pixel pitch of 100×100 µm.

11. The method of claim 9, wherein generating imaging data signals in low-dose protocols comprises reading out rectangular pixels of each pair individually at the pixel pitch of 50×100 µm.

12. The method of claim 11, further comprising, when the imaging system protocol is a high-dose protocol:

translating the detector by 50 µm along a first direction;

generating two images from the read-out rectangular pixels at the pixel pitch of 50×100 µm; and combining the two images into one image, wherein the one image has an effective pixel pitch of 50×50 µm.

13. The method of claim 12, wherein combining the two images into one image comprises applying one or more of an inverse filter and a noise regularization filter.

14. An imaging system, comprising:

an x-ray detector comprising a matrix of rectangular pixel pairs, wherein each pixel in each pixel pair comprises a thin film transistor (TFT), a TFT control line, and a data read out line, wherein each pixel of each rectangular pixel pair is configured with a first dimension and a second dimension, the second dimension being half a length of the first dimension.

15. The imaging system of claim 14, wherein each pixel of each rectangular pixel pair has a pixel pitch of 50×100 µm, wherein the first dimension is 100 µm and the second dimension is 50 µm.

16. The imaging system of claim 14, wherein the TFT control line of each pixel in each rectangular pixel pair is energized simultaneously in low-dose applications.

17. The imaging system of claim 14, wherein the TFT control line of each pixel in each rectangular pixel pair is energized sequentially in high-dose applications.

18. The imaging system of claim 14, wherein the x-ray detector is configured to translate half the length of the first dimension along a direction of the first dimension.

19. The imaging system of claim 18, wherein the x-ray detector is configured to receive radiation rays from a radiation source emitting a pulse the radiation rays, wherein in high-dose applications, the radiation source is configured to split the pulse of the radiation rays in two halves and wherein the x-ray detector is configured translate the half the length of the first dimension along the direction of the first dimension between the two halves of the pulse.

20. The imaging system of claim 18, wherein the x-ray detector is configured to receive radiation rays from a radiation source emitting a pulse of the radiation rays, wherein in high-dose applications, the x-ray detector is configured to translate the half the length of the first dimension along the direction of the first dimension during the pulse of the radiation rays.

* * * * *